(12) United States Patent
Craven et al.

(10) Patent No.: US 9,106,241 B2
(45) Date of Patent: Aug. 11, 2015

(54) PREDICTION OF SIGNALS

(76) Inventors: Peter Graham Craven, London (GB);
Malcolm Law, West Sussex (GB)

(*) Notice: Subject to any disclaimer, the term of this patent is extended or adjusted under 35 U.S.C. 154(b) by 545 days.

(21) Appl. No.: 13/520,833

(22) PCT Filed: Sep. 2, 2010

(86) PCT No.: PCT/GB2010/001663
§ 371 (c)(1),
(2), (4) Date: Nov. 15, 2012

(87) PCT Pub. No.: WO2011/027114
PCT Pub. Date: Mar. 10, 2011

(65) Prior Publication Data
US 2013/0051579 A1    Feb. 28, 2013

(30) Foreign Application Priority Data

Sep. 3, 2009 (GB) .................................. 0915395.8

(51) Int. Cl.
*H03G 5/00* (2006.01)
*H03M 3/04* (2006.01)
(Continued)

(52) U.S. Cl.
CPC ............... *H03M 3/042* (2013.01); *G10L 19/04* (2013.01); *G10L 21/00* (2013.01)

(58) Field of Classification Search
CPC .... G10L 19/008; G10L 19/00; H04S 2420/03
USPC ............... 381/23, 98; 704/212, 500; 375/242, 375/353, 254
See application file for complete search history.

(56) References Cited

U.S. PATENT DOCUMENTS 5,434,948 A * 7/1995 Holt et al. ...................... 704/220
5,912,966 A * 6/1999 Ho ........................... 379/406.05
(Continued)

FOREIGN PATENT DOCUMENTS

EP      1 879 181 A1    1/2008
WO    2004/017303 A1    2/2004

OTHER PUBLICATIONS

Scott C. Douglas et al., "Self-Whitening Algorithms for Adaptive Equalization and Deconvolution", IEEE Transactions on Signal Processing, vol. 47, No. 4, Apr. 1, 1999, XP011058503, ISSN: 1053-587X, (pp. 1161-1165, 5 pages total).
(Continued)

*Primary Examiner* — Alexander Jamal
(74) *Attorney, Agent, or Firm* — Buckley, Maschoff & Talwalkar LLC

(57) ABSTRACT

In lossy data compression of a signal using ADPCM, an adaptive decorrelation or "prediction" filter is used to reduce the amplitude of the signal, the spectral dynamic range of the signal also being reduced. This latter reduction is effected in a nonuniform manner, if known techniques are used, with regions of high spectral density being compressed more than regions of low spectral density. The present invention recognises that using a uniform compression ratio results in a better tradeoff between compression and robustness to transmission channel errors. A method is described for obtaining a uniform compression ratio by adjusting coefficients of the decorrelation filter in dependence on coefficients of an adaptive training filter that is fed from the output of the decorrelation filter. A reverse method is also provided along with encoder, decoder and codec implementing the techniques.

31 Claims, 9 Drawing Sheets

(51) Int. Cl.
*G10L 19/04* (2013.01)
*G10L 21/00* (2013.01)

(56) References Cited

U.S. PATENT DOCUMENTS 5,915,235 A 6/1999 DeJaco et al.
2001/0040927 A1* 11/2001 Chu .............................. 375/254
2004/0019481 A1 1/2004 Saito

OTHER PUBLICATIONS

Jerry D. Gibson et al., "Kalman Backward Adaptive Predictor Coefficient Identification in ADPCM with PCQ", IEEE Transactions on Communications, vol. COM-28, No. 3, Mar. 1, 1980, XP002613185, (pp. 361-371, 11 pages total).

"PCT Notification of the International Search Report and the Written Opinion of the International Searching Authority", dated Dec. 22, 2010, for International Application No. PCT/GB2010/001663, 15pgs.

Patents Act 1977: Combined Search and Examination Report and Response under Sections 17 and 18(3), dated Sep. 22, 2009, for GB Application No. GB0915395.8, 10pgs.

Voluntary Amendments to combined Search and Examination Report, filed Nov. 27, 2009, for British Patent No. 0915395.8, 5pgs.

* cited by examiner

----- A: Original spectrum
——— B: LMS without leakage
━━━ C: Compressed 4:1

----- A: Original spectrum
——— B: LMS with leakage
━━━ C: Compressed 4:1

PREDICTION OF SIGNALS

This application is a U.S. National Stage filing under 35 U.S.C. §371 and 35 U.S.C §119, based on and claiming priority to PCT/GB2010/001663 for "PREDICTION OF SIGNALS" filed Sep. 2, 2010, claiming priority to GB Patent Application No. 0915395.8 filed Sep. 3, 2009.

FIELD OF THE INVENTION

The present invention relates to the field of audio signal encoding and decoding techniques and to Adaptive Differential Pulse Code Modulation (ADPCM) techniques in particular.

BACKGROUND TO THE INVENTION

For the purpose of data compression, samples of a digital audio signal are frequently coded using entropy coding. However, such samples typically exhibit substantial temporal correlation, leading to redundancy in the compressed stream if they are coded independently. If this redundancy is removed or reduced, the compressed data rate can be reduced further. For example, in a transform based encoder, the correlation causes the signal power to be concentrated in a few of the transformed bands, and the remaining, low-power bands can be adequately represented by a smaller number of bits.

In an Adaptive Differential Pulse Code Modulation (ADPCM) encoder, the current audio sample is predicted on the basis of previous samples, and the predicted value subtracted from the actual current value audio to leave a 'residual'. An approximation to the residual is communicated over a transmission channel to the ADPCM decoder which similarly computes a predicted value. The decoder then adds the residual to the predicted value in order to reconstruct an approximation to the original audio sample. The sequence of residual samples is known as an 'innovation signal' because it contains that which was not predicted and is therefore new, and the ratio between the audio signal power and the innovation signal power is termed the prediction gain.

It is generally desirable to maximise the prediction gain, i.e. to minimise the innovation signal power, in order to minimise the data rate required to transmit the innovation signal. Linear prediction is almost invariably used and, according to linear prediction theory, the prediction gain is maximised when temporal correlation has been removed. This criterion is equivalent to saying that, viewed in the frequency domain, the innovation signal has a white spectrum. The process of subtracting a linear prediction from the input signal can be expressed as a filtering operation performed by a filter whose z-transform response is $W(z)$. In order to produce a white innovation spectrum the filter $W(z)$ needs to have an amplitude response equal to the inverse of the amplitude spectrum of the input audio signal. Frequently, an adjustable or reconfigurable filter is used in order to follow, at least to some extent, variations in the input spectrum.

The prediction algorithms in an ADPCM encoder and in the corresponding decoder should be kept in step with each other so that the decoder can accurately invert the encoder's prediction processing at all times and there are three methods of achieving this. A fixed predictor can be used, or the encoder can choose suitable predictor settings from time to time and communicate these settings to the decoder, or the encoder and decoder can both use a common method of adapting predictor settings from the innovation signal as conveyed over the transmission channel. This last method is termed backwards adaptive prediction and the invention concerns a method for backwards adaptive prediction.

Backwards adaptive prediction requires of the predictor adaptation method not only that it should result in a predictor having a useful prediction gain, but also that it should be robust against transmission errors. That is, when implemented in both an encoder and a decoder, the decoder's prediction settings should converge to those of the encoder, for example on start up or after a transmission error. Moreover, a transmission error should not perturb the decoder's setting more than necessary. It is usual to employ a filter of fixed architecture but with dynamically adjustable coefficients.

Prediction filters may be implemented digitally in a transversal (Finite Impulse Response or FIR) or a recursive (Infinite Impulse Response or IIR) structure, or a combination of both. Known algorithms for adapting or training a filter include the least-mean-squares (LMS) algorithm of Widrow and Hoff (Bernard Widrow, Samuel D. Stearns in "Adaptive Signal Processing", Prentice Hall, 1985, ISBN 0-13-004029-0) and its variants. In the context of an encoder, this algorithm explicitly attempts to minimise the power in the residual signal. In order to keep the adaptations within the encoder and decoder in step with each other, both must operate from the same signal, and to this end the encoder quantises the signal for transmission and then uses an inverse quantiser to reconstruct a signal from which both the encoder and the decoder can adapt their predictors.

Whether or not in the context of an ADPCM codec, it is conventional to incorporate 'leakage' into an LMS implementation, to improve the stability of the adaptation and prevent filter coefficients from wandering in the presence of arithmetic rounding errors. In an ADPCM codec, however, prediction gain will generally be significantly reduced if sufficient leakage is applied to provide adequate stability of the adaptation. It would therefore be desirable to provide high prediction gain while maintaining good stability and convergence properties in the adaptation.

SUMMARY OF THE INVENTION

According to a first aspect of the present invention there is provided a method of adaptively filtering an input signal having an input spectral dynamic range and related to an audio signal to furnish a partially whitened signal having a reduced spectral dynamic range compared to the input spectral dynamic range, the method comprising the steps of:

filtering the input signal in dependence on adjustable time-varying coefficients to furnish the partially whitened signal, the relationship of the partially whitened signal to the input signal being described by a time-varying response $W(z)$;

feeding the partially whitened signal to a first adaptive whitening filter having coefficients that vary with time, the first adaptive whitening filter filtering the partially whitened signal with a time-varying response $F_1(z)$; and, adjusting the adjustable time-varying coefficients in dependence on the coefficients of the first adaptive whitening filter.

The present invention thus employs a filter depending on adjustable time-varying coefficients to furnish a partially whitened signal and also employs an adaptive whitening filter for performing a further filtering operation. In many embodiments any signal that results from the filtering by the adaptive whitening filter is not used except internally to guide the adaptation. Rather, the purpose of the adaptive whitening filter is to provide coefficients which vary with time, which represent the response $F_1(z)$, which depend on the spectrum of the partially whitened signal and which are used in the step of adjusting. The invention in its first aspect thus allows $W(z)$ to depend on the spectrum of the partially whitened signal in a controlled manner. This allows the spectral relationship of the partially whitened or 'compressed' signal to depend in a controlled manner on the spectrum of the input signal, in contrast to prior art methods that provide a compressed signal which is the output of a whitening filter, and which is fully whitened except for imperfections and limitations of the whitening filter that may be more difficult to control.

According to a second aspect of the present invention there is provided a method of adaptively filtering a partially whitened signal having a reduced spectral dynamic range to produce an output signal having an output spectral dynamic range which is increased compared to the reduced spectral dynamic range, the method comprising the steps of:

filtering the partially whitened signal in dependence on adjustable time-varying coefficients to furnish the output signal, the relationship of the output signal to the partially whitened signal being described by a time-varying response $W^{-1}(z)$;

feeding the partially whitened signal to a first adaptive whitening filter having coefficients that vary with time, the first adaptive whitening filter filtering the partially whitened signal with a time-varying response $F_1(z)$; and, adjusting the adjustable time-varying coefficients in dependence on the coefficients of the first adaptive whitening filter.

In this way, the method allows $W^{-1}(z)$ to depend on $F_1(z)$, and hence on the spectrum of the partially whitened signal, in a controlled manner. If suitably configured, the invention in its second aspect may thus substantially invert the processing performed by the invention its first aspect.

In some embodiments, one or more of the adjustable time-varying coefficients are identified with coefficients of the first adaptive whitening filter, such that the step of adjusting those coefficients is performed as part of normal operation of the first adaptive whitening filter. That is, an adaptive whitening filter adjusts its own coefficients, and therefore if these are identified with the adjustable time varying coefficients, for example by using shared memory, then those other coefficients are adjusted automatically.

In some embodiments, the step of adjusting comprises copying coefficients of the first adaptive whitening filter to the adjustable time-varying coefficients. Preferably, the copying comprises scaling a coefficient by a factor $\gamma^j$, where $0.7 < \gamma \leq 1$ and where the coefficient multiplies a signal sample having a delay of j samples. This provides a safety margin to ensure that the step of filtering the input signal is minimum-phase, or alternatively that the step of filtering the partially whitened signal according to the second aspect does not result in excessively high amplification.

In the method of the first aspect, the time-varying response $W(z)$ may incorporate a factor $F_2(z/\gamma)^n$ where $0.7 < \gamma \leq 1$ and where n is a positive integer. Similarly, in the method of the second aspect, the time-varying response $W^{-1}(z)$ may incorporate a factor $F_1(z/\gamma)^{-n}$ where $0.7 < \gamma \leq 1$ and where n is a positive integer. Preferably, the positive integer n is selected from the integers 1, 2, 3, 4 and 5.

In some embodiments the step of filtering may be performed using a component filter whose response is proportional to $F_1(z/\gamma)-1$.

The method of the first aspect may comprise the further step of feeding the partially whitened signal to a second adaptive whitening filter, wherein the second adaptive whitening filter filters the partially whitened signal with a time-varying response $F_2(z)$, and wherein the response $W(z)$ incorporates a factor $F_2(z/\gamma_2)^{n_2} F_2(z/\gamma_2)^{n_2}$ for some $\gamma_1, \gamma_2 \leq 1$ and integers $n_1, n_2 \geq 1$.

In a similar manner, the method of the second aspect may comprise the further step of feeding the partially whitened signal to a second adaptive whitening filter, wherein the second adaptive whitening filter filters the partially whitened signal with a time-varying response $F_2(z)$, and wherein the response $W^{-1}(z)$ incorporates a factor:

$$F_1\left(\frac{z}{\gamma_1}\right)^{(-n_1)} F_2\left(\frac{z}{\gamma_2}\right)^{(-n_2)}$$

for some $\gamma_1, \gamma_2 \leq 1$ and integers $n_1, n_2 \geq 1$.

Preferably, the second adaptive whitening filter has lower spectral resolution and adapts more quickly than the first adaptive whitening filter. This allows fast adaptation to sudden changes in broad spectral features of the input signal, while avoiding stability problems that typically occur when an attempt is made to provide fast adaptation simultaneously with high spectral resolution.

It is also preferred that the second adaptive whitening filter has lower spectral resolution than the first adaptive whitening filter and that $n_2 > n_1$. This allows broad spectral features of the input signal to be compressed more heavily than narrower features, thus avoiding stability problems that typically occur when an attempt is made to provide high compression with a filter of high spectral resolution.

In the method of the first aspect, the time-varying response $W(z)$ may incorporate a fixed factor $K(z)$ where $K(z) \neq 1$. Likewise, in the method of the second aspect, the time-varying response $W^{-1}(z)$ may incorporate a fixed factor $K^{-1}(z)$ where $K(z) \neq 1$. This allows a falling spectral density representative of typical audio signals to be compensated (or, according to the second aspect, reconstituted) by a fixed filter, the time-varying filters thereby needing to provide less compression in order reduce the spectral dynamic range of the partially whitened signal to an acceptable level.

Preferably, the first adaptive whitening filter is an FIR filter that adapts its coefficients based on the method of Widrow and Hoff.

Preferably, in the method of the first aspect, the step of filtering comprises the steps of:

generating a predicted sample of the input signal in dependence on previous samples of the partially whitened signal and on the adjustable time-varying coefficients;

subtracting the predicted sample from a sample of the input signal to furnish a difference sample; and, deriving a sample of the partially whitened signal in dependence on the difference sample.

The step of deriving may comprise quantising the difference sample or a sample generated therefrom. The latter takes account of the fact that the difference sample may be processed before quantisation. Additionally, or alternatively, the step of deriving comprises furnishing a normalised version of the partially whitened signal, and the step of feeding feeds the normalised version of the partially whitened signal to the first adaptive whitening filter.

Similarly, in the method of the second aspect, it is preferred that the step of filtering comprises the steps of:

generating a predicted sample of the input signal in dependence on previous samples of the partially whitened signal and on the adjustable time-varying coefficients; and, adding the predicted sample to a sample of the partially whitened signal to furnish a sample of the output signal.

According to a third aspect of the present invention, there is provided an encoder adapted to encode a signal according to the method of the first aspect. Preferably, the encoder is an Adaptive Differential Pulse Code Modulation (ADPCM) encoder.

According to a fourth aspect of the present invention, there is provided a decoder adapted to decode a signal according to the method of the second aspect. Preferably, the decoder is an Adaptive Differential Pulse Code Modulation (ADPCM) decoder.

According to a fifth aspect of the present invention, a codec comprises an encoder according to the third aspect in combination with a decoder according to the fourth aspect, wherein the decoder is adapted to produce the output signal having a spectrum substantially the same as a spectrum of the input signal to the encoder. In this way, the decoder substantially undoes the actions of the encoder. The qualifier "substantially" serves to emphasise the fact that the recovered signal may not be identical, since quantisation noise may "fill in" any deep troughs that were present in the input spectrum. However, the output signal components that are correlated with input signal components should have the same spectrum as those input signal components. This condition need not apply to noise components, particularly those that are uncorrelated.

According to a sixth aspect of the present invention, a data carrier comprises an audio signal encoded using the method of the first aspect.

According to a seventh aspect of the present invention, there is provided an encoder for encoding an audio signal, the encoder comprising an adaptive filter that compresses the spectral dynamic range of an input signal by a substantially constant ratio.

Using known techniques, such as LMS (with leakage), the compression ratio applied to a "sine-wave" variation of an input spectrum, for example, is vastly higher when the sine wave is on a high part of the spectrum than when it is on a low-level part of the spectrum. By comparison the present invention manages substantially similar compression in the two cases.

Preferably, a local spectral feature is compressed by a ratio that does not change by more than a factor of two when the input signal changes to reduce the spectral density in the vicinity of the feature from 0 dB to −20 dB relative to the largest spectral density within the spectrum, and wherein the compression ratio is at least a factor 1.5:1 when said spectral density in the vicinity is −20 dB.

The intention here is that the "local feature" is superposed on either a loud part of the spectrum or a quiet part. Moreover, the test is actually performed twice, with the signal being either loud or quiet in the region of the feature. The term "Local spectral feature" might imply a visually identifiable feature, but in the case of a low order filter the compression will not be able to follow any detail of something "local" nor get the same clear compression. Therefore, what is actually intended here is that, if one were to take a first spectrum and make a "broad" perturbation in a region of it where the spectral density is high, and then apply the same perturbation to a second spectrum having a low spectral density in the same region (e.g. lower by 20 dB), then on comparing all four compressed spectra, one would find that the perturbation has made substantially the same difference in the two cases. For example, the two compressed perturbations might be within a factor of two of each other.

As will be appreciated by those skilled in the art, the present invention provides an ADPCM encoder and decoder, the encoder receiving an input signal and transmitting information relating to a quantised innovation signal to the decoder. The decoder reconstructs a replica of the quantised innovation signal and both the encoder and decoder train the coefficients of a first adaptive whitening filter having time-varying response denoted by $F(z)$ so as to substantially whiten the quantised innovation signal, within the modelling capability of said filter.

No signal output from this adaptive whitening filter is used for prediction purposes. Instead, the signal path from the input of the encoder to the quantised innovation signal includes a further filter whose coefficients are continually adjusted in dependence on the coefficients of the adaptive whitening filter so that the transfer function from the signal input to the quantiser has a response that includes a factor $F(z)^n$ for some $n \geq 1$, or alternatively $F(z/\gamma)^n$ where $0.7 < \gamma \leq 1$. The decoder similarly comprises a reconstruction filter whose coefficients are continually adjusted in dependence on the adaptive whitening filter within the decoder so that the reconstruction filter has a response that includes a factor $F(z)^{-n}$ or $F(z/\gamma)^{-n}$. The adjusting may be accomplished by using the same storage for the coefficients of the further filter or reconstruction filter as for the adaptive whitening filter, or alternatively by continually copying the coefficients of the adaptive whitening filter.

The further filter may comprise n cascaded filters whose coefficients are adjusted in dependence on the coefficients of the adaptive whitening filter. The quantised innovation signal can be normalised to have a reduced dynamic range relative to the input signal. The encoder and decoder can both use the quantised innovation signal to train also a second adaptive whitening filter having a different modelling capability from the first adaptive whitening filter. Thus, the further filter in the encoder then comprises also one or more filters whose coefficients are adjusted in dependence on the coefficients of the second adaptive whitening filter, and similarly for the reconstruction filter in the decoder.

BRIEF DESCRIPTION OF THE DRAWINGS

Examples of the present invention will now be described in detail with reference to the accompanying drawings, in which.

DETAILED DESCRIPTION OF THE INVENTION

The invention will now be described with reference to the figures, in which circles represent arithmetic addition except where otherwise indicated by a minus sign or a multiplication sign.

Figure 1:
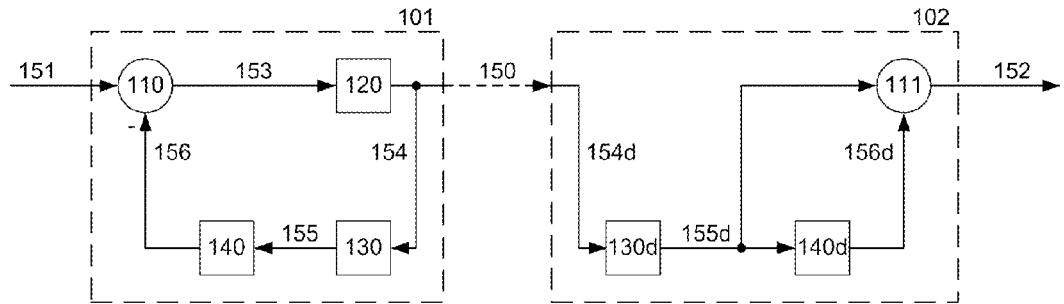
FIG. 1 shows a known ADPCM codec with adaptive quantiser, inverse quantiser, predictor and summation nodes.

FIG. 1 shows in outline the structure of a prior art backwards adaptive ADPCM codec comprising an encoder 101 and a decoder 102. The encoder 101 contains a subtractor 110 that generates a difference signal 153, also known as an unquantised innovation signal, by subtracting a predicted signal 156 from the encoder's input signal 151. The difference signal is quantised by quantiser 120 to furnish a stream of symbols 154. An inverse quantiser 130 reconstructs a quantised innovation signal (hereinafter referred to as a QIS) 155, this being an approximation to the unquantised innovation signal 153. The QIS 155 is then fed to the predictor 140, which furnishes the predicted signal 156 in dependence on previous samples of the QIS, thus avoiding a delay-free feedback loop. The symbol stream 154 is also conveyed by a communication path 150 to the decoder.

The decoder 102 feeds a received symbol stream 154d to an inverse quantiser 130d which furnishes a received QIS 155d. The received QIS 155d is fed to an adaptive predictor 140d to furnish a predicted signal 156d. The adder 111 adds the predicted signal 156d to the received QIS 155d to furnish the decoder's output signal 152.

In a practical system, the communication path 150 often includes an entropy coder followed by a data formatting unit within the encoder 101, then data storage or a data transmission path to the decoder 102, which in turn unpacks the data and entropy decodes it if necessary to recover the stream of symbols 154d. These aspects are not the subject of the invention and so have not been shown explicitly, it being assumed simply that, subject to transmission errors, the communication path furnishes for the decoder a stream of symbols 154d that is a replica of the symbol stream 154 in the encoder.

Thus, in the absence of transmission errors, and subject to appropriate stability and start-up conditions, signals 155 and 155d in the encoder and decoder respectively should be identical, hence the two filters 140 and 140d should adapt in the same manner and the two predicted signals 156 and 156d should also be identical. It follows that, to the extent that the quantised innovation signal 155 approximates the unquantised innovation signal 153, the decoder's output signal 152 will approximate the encoder's input signal 151.

Figure 2A:
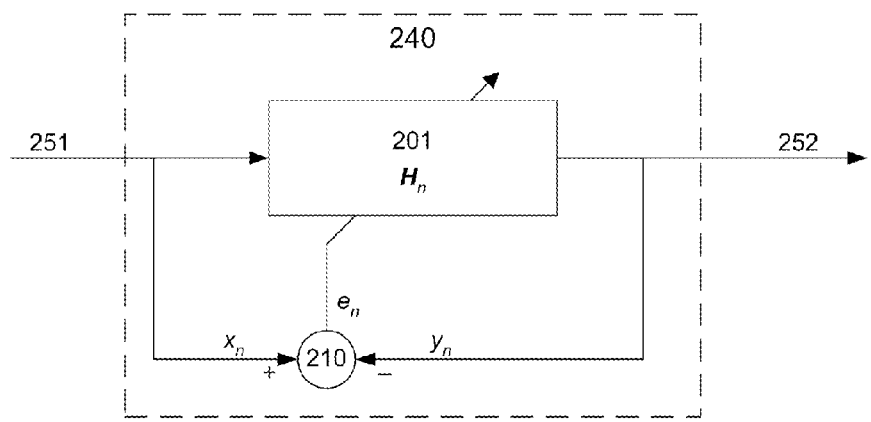
FIGS. 2A and 2B show known LMS filter adaptation.

Prior-art adaptation of an FIR predictor by the LMS method of Widrow and Hoff (Bernard Widrow, Samuel D. Stearns in "Adaptive Signal Processing", Prentice Hall, 1985, ISBN 0-13-004029-0) is now reviewed with reference to FIG. 2A. At time-step n, the input signal 251 has sample value $x_n$ and the transversal filter 201 of length p computes the predicted sample $y_n$ from the p previous input sample values $x_{n-1} \ldots x_{n-p}$ using the formula:

$$y_n = \sum_{i=1}^{p} H_{n,i} x_{n-i} \qquad (1)$$

where $H_{n,1} \ldots H_{n,p}$ are the p time-varying coefficient values of a prediction filter H at time-step n. The LMS coefficient adaptation formula is then:

$$H_{n+1,i} = (1-\lambda)H_{n,i} + \mu e_n x_{n-i}\ i=1 \ldots p \qquad (2)$$

where:

$\lambda$ lies in the range $0 \leq \lambda \leq 1$ and controls leakage; $\lambda=0$ for no leakage $\mu>0$ controls speed of adjustment $e_n$ is the error signal $x_n - y_n$ furnished by subtractor 210.

Alternatively, the normalised update formula known as NMLS may be used in order to render the adjustment speed independent of the overall scaling of the input signal 251:

$$H_{n+1,i} = (1-\lambda)H_{n,i} + \frac{\mu e_n x_{n-i}}{\sum_{j=1}^{p} x_{n-j}^2} \qquad (3)$$

$$i = 1 \ldots p$$

Strictly, z-transform techniques apply only to fixed filters, but if time variation is ignored we can denote the transfer function of H by H(z). Similarly denoting the transfer function from $\{x_n\}$ to $\{e_n\}$ by F(z), we have:

$$F(z) = 1 - H(z) \qquad (4)$$

For stationary signals, with $\lambda=0$ and with small $\mu$, the update formula (2) or (3) adjusts the coefficients of filter H so as to minimise the mean-square value of $\{e_n\}$. It can be shown that this corresponds in the spectral domain to whitening the spectrum of $\{e_n\}$, provided the length p of filter H is sufficiently large. Hence we refer to F(z) a whitening filter, though the whitening is in general imperfect because of the finite length of H. We say that $\{x_n\}$ has been whitened to furnish $\{e_n\}$, subject to the modelling capability of filter F(z).

Note that H has no delay-free path, that is $H(z)=H_1.z^{-1}+H_2.z^{-2}\ldots+H_p.z^{-p}$ with no term in $z^0$, and the same is therefore true of $1-F(z)$ or of $F(z)-1$, a fact that will be used later.

Figure 2B:
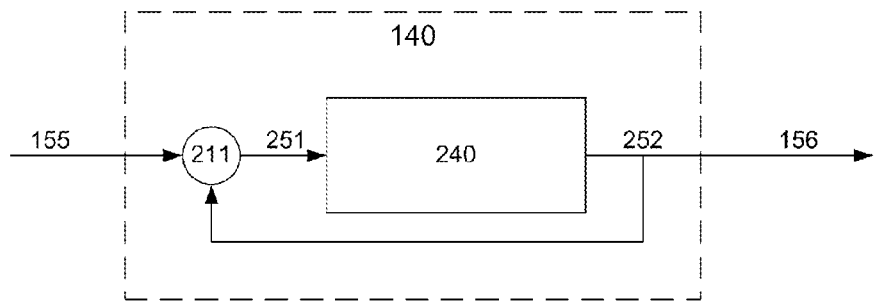

FIG. 2B shows how predictor 240 may be incorporated with adder 211 in a feedback loop, the combination 140 being directly usable in the encoder 101, the decoder 102 containing a replica 140d. The transfer function of 140 is $H(z)/(1-H(z))$. Then in FIG. 1, taking into account the feedback via subtractor 110, it can be shown that the total filtering provided by encoder 101, that is the transfer function from the input 151 to the QIS 155, is $1-H(z)$, which as shown above is F(z), a whitening filter. Thus, the architecture of FIG. 1 whitens the input signal, within the modelling limitations of the filter H, in order to produce the Quantised Innovation Signal that is transmitted. Equivalently, in the time domain, the transfer function F(z) attempts to remove temporal correlations that exist in the input signal, and is thereby termed a decorrelation filter.

Inspection of FIG. 2 shows that signal 155 is equal to signal $e_n$. Thus in attempting to minimise the error signal $e_n$, the adaptation is also attempting to minimise signal 155, which in the context of FIG. 1 is the QIS. Minimising the QIS will generally minimise the transmitted data rate and/or maximise the resolution provided by an ADPCM codec, and the factor by which the QIS 155 is smaller than the input signal 151 is called the 'prediction gain'.

We now consider the effect of transmission channel errors, which cause erroneous symbols to be received by the decoder, in turn resulting in disturbances to the output 155d of the decoder's inverse quantiser 130d. These disturbances propagate to the decoder's output by at least three mechanisms: directly via adder 111, via the signal path of the predictor 140d and also by perturbing the adaptation of the adaptive predictor 140d, causing the spectral shape of the decoded output to be altered. It is the object of the invention to minimise the effect of the last of these three disturbance mechanisms In the prior art it is known that the perturbation to the adaptation caused by transmission channel errors can be reduced by applying leakage or 'damping' to the predictor's coefficients, but that such leakage also degrades system performance when there are no errors (Gibson, J. D. et. al., "Kalman Backward Adaptive Predictor Coefficient Identification in ADPCM with PCQ", IEEE trans. Communications, vol. COM-28 no. 3, 1980 March). A prior art ADPCM codec using IIR prediction filters including leakage is described in detail in Recommendation G.722"7 kHz Audio—Coding within 64 kbit/s", International Telecommunications Union, 1988 & 1993.

The present invention recognises that the effect of the adaptive predictor in the decoder is to detect small deviations from of the spectrum of the received QIS 155b relative to a completely flat or 'white' spectrum, and to amplify these deviations so that is the final decoded signal 152 has the same spectrum as the original signal 151. Thus, although optimal prediction gain would require almost complete whitening of the QIS, such almost complete whitening would require the decoder to amplify the remaining small deviations to an excessive extent, also amplifying spectral disturbances caused by transmission errors.

Fortunately, it can be shown that a variation of about 12 dB in spectral density can be tolerated in the QIS without significant adverse effect on the prediction gain, though a variation significantly greater than 12 dB, except for narrow bands of lower spectral density, will significantly reduce prediction gain. The invention therefore attempts to compress the input spectral dynamic range in a controlled manner, such that the range of 40 dB or more found in many audio signals can be compressed into a smaller range, perhaps of order 12 dB.

If all that were required was compression of a larger spectral range into a smaller one, then the prior art use of leakage would suffice. However leakage does not perform this compression in an optimal way, as we shall now show.

Figure 3A:
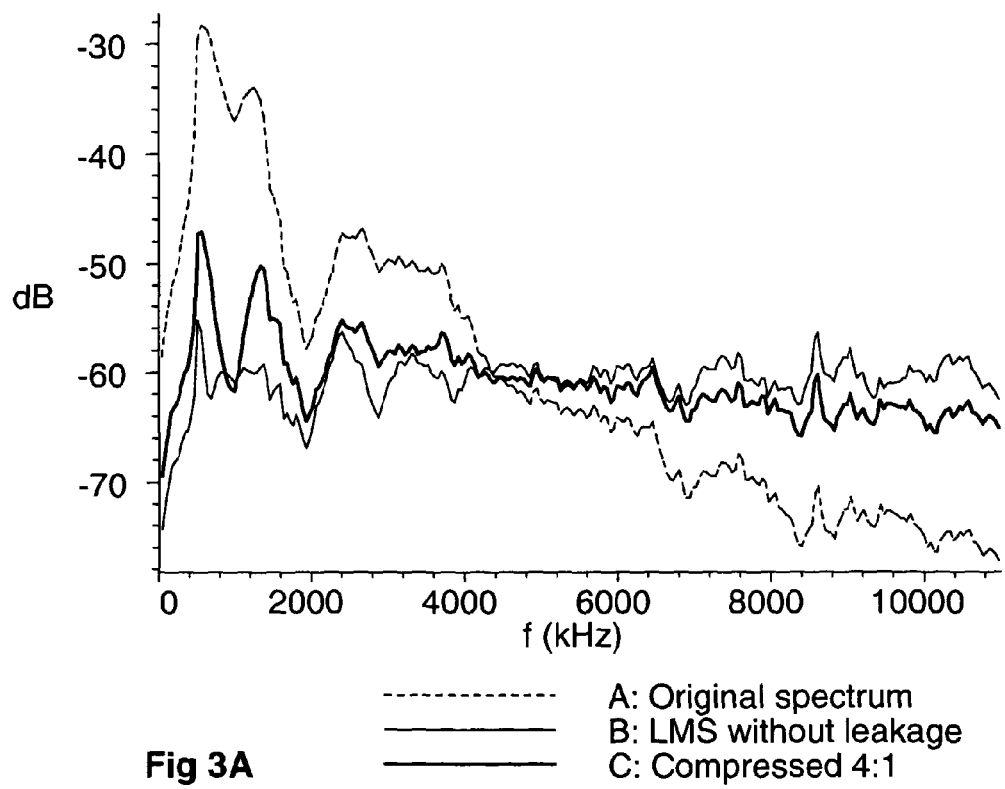
FIG. 3A shows a spectrum of a real audio signal, and of the same signal processed by LMS adapted FIR filter without leakage, and by the invention.

In FIG. 3A trace A (dashed line) shows the spectrum of an original audio signal, having a spectral dynamic range of nearly 50 dB. Trace B (solid line) shows the spectrum after whitening by a 17th order FIR filter. The filter has been fully adapted by an LMS algorithm without leakage, and achieves a prediction gain of 17.5 dB. Fine detail that cannot be modelled by a 17th order filter is retained in trace B, but the overall downward trend and other broad features are not visible and a decoder has little or no information on which to reconstruct these aspects. Trace C (thick line), is a partially whitened spectrum in which the spectral dynamic range has been reduced to about 12 dB according to the invention. The overall trend is visible as are the other broad features, the notch at about 700 Hz even being somewhat exaggerated because of the finite order of the FIR filter. The prediction gain is now 15.9 dB, a sacrifice of 1.6 dB relative to full whitening.

Figure 3B:
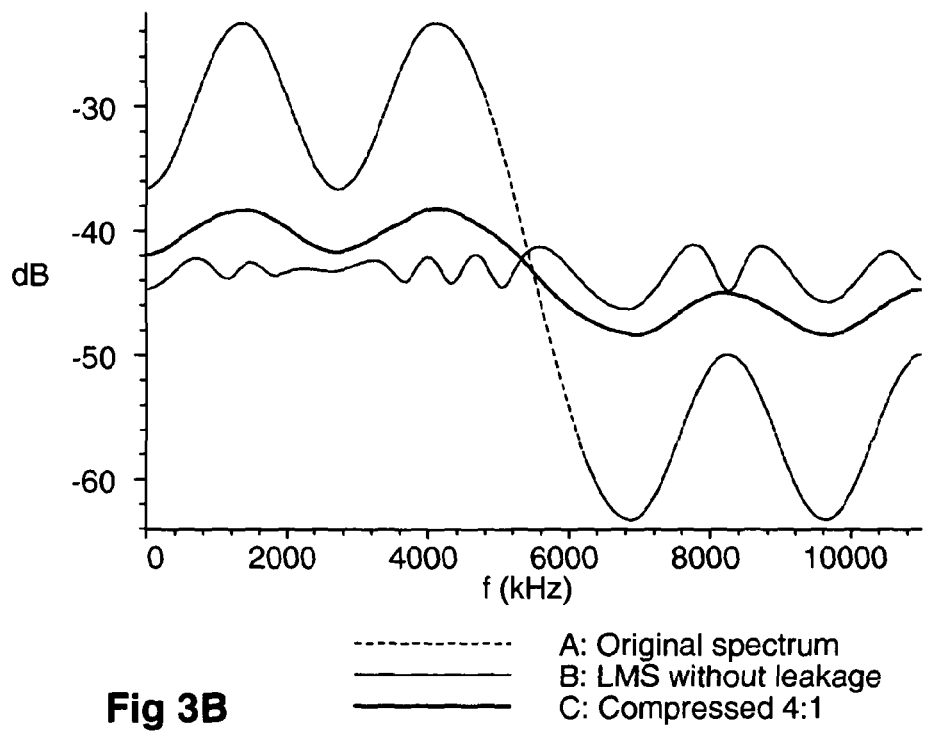
FIG. 3B shows a spectrum of a synthetic audio signal, and of the same signal processed by LMS adapted FIR filter without leakage, and by the invention.

FIG. 3B is similar to FIG. 3A, except that the original spectrum of trace A is an artificial spectrum chosen to lie substantially within the modelling capability of the 17th order filter, which is able to whiten or compress the spectrum almost completely as shown in trace B.

In trace C of each of FIGS. 3A and 3B, the invention has been configured to reduce the input spectral input range by a factor four, so that each 1 dB change in input spectrum causes a change of about 0.25 dB in the output spectrum. If the encoder applies this compression factor of four uniformly throughout the spectral dynamic range of the input signal, then the action of a decoder should be to expand the changes in the spectrum of the QIS by a constant factor four, so that each 0.25 dB change in the QIS spectrum results in a 1 dB change in the output spectrum. Changes in the received QIS spectrum caused by transmission errors will also be expanded by a factor four. In general the compression ratio must be chosen as a compromise: a higher ratio causing amplification of errors in the decoder and a lower ratio resulting in a loss of prediction gain.

Figure 3C:
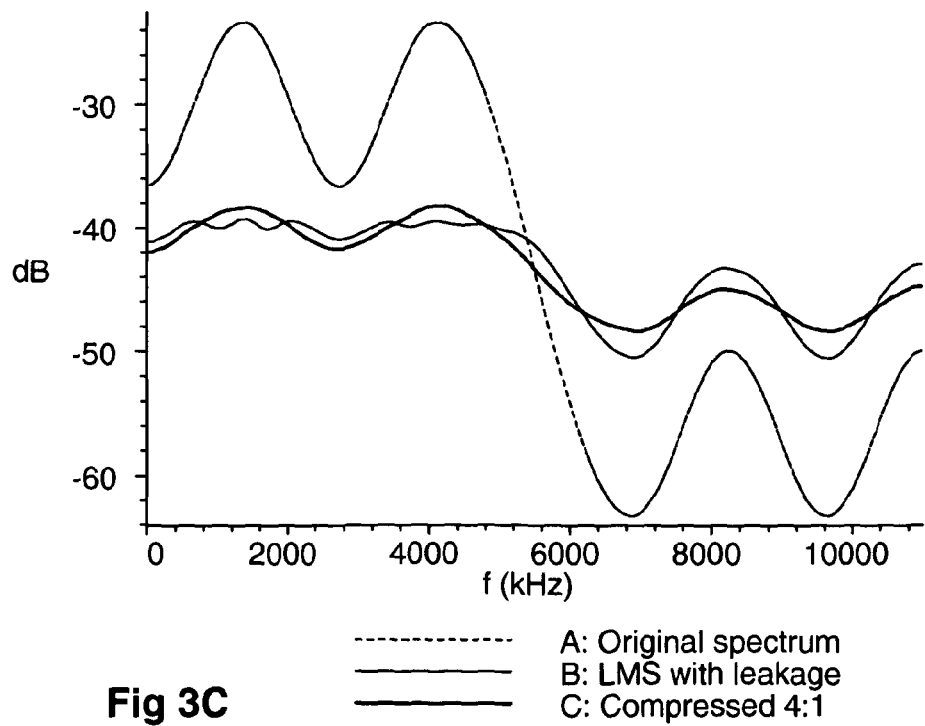
FIG. 3C shows a spectrum of a synthetic audio signal, and of the same signal processed by LMS adapted FIR filter with leakage, and by the invention.

FIG. 3C is like FIG. 3B except that in trace B of FIG. 3C, leakage is added to the LMS algorithm in an attempt to provide controlled spectral compression. However, while leakage restrains the prediction filtering from applying a high gain in frequency regions where the input signal has a low spectral density, moderate leakage has little effect where the input spectrum is strong. Thus features of trace A in the range 6 kHz-11 kHz, where the original signal was weak, are reproduced with only moderate compression in trace B, whereas features in the region 0-5 kHz, where the original signal was strong, have been compressed to the extent that they are scarcely recognisable. For these original features to be reproduced in the decoded signal 152, the decoder would need to expand the corresponding compressed features in signal 155d by a large factor, with consequent large amplification of any perturbation of the received compressed spectrum caused by transmission errors. Further, these amplified perturbations to the spectral shape are likely to occur in regions of high audibility.

A more nearly uniform compression ratio produced by an encoder according to the invention is shown in trace C of FIG. 3B and again in FIG. 3C. In this case the encoder is configured for a compression ratio of 4:1. The prediction gain is 11.4 dB, a sacrifice of 1.1 dB relative to the 12.5 dB prediction gain of LMS without leakage, trace B of FIG. 3B. The leakage used for trace B of FIG. 3C was adjusted to give the same prediction gain of 11.4 dB, so that the performance of the invention and of the prior-art use of leakage can be validly compared in traces B and C of this figure.

The invention does not require that the compression ratio provided by the encoder be completely uniform, but a reasonable design aim is to ensure that the spectral compression ratio provided by the encoder does not vary by more than a factor two as the input spectral density varies over a useful range of 20 dB, for example a range extending from the highest spectral density in the signal to a density 20 dB below that.

Figure 4A:
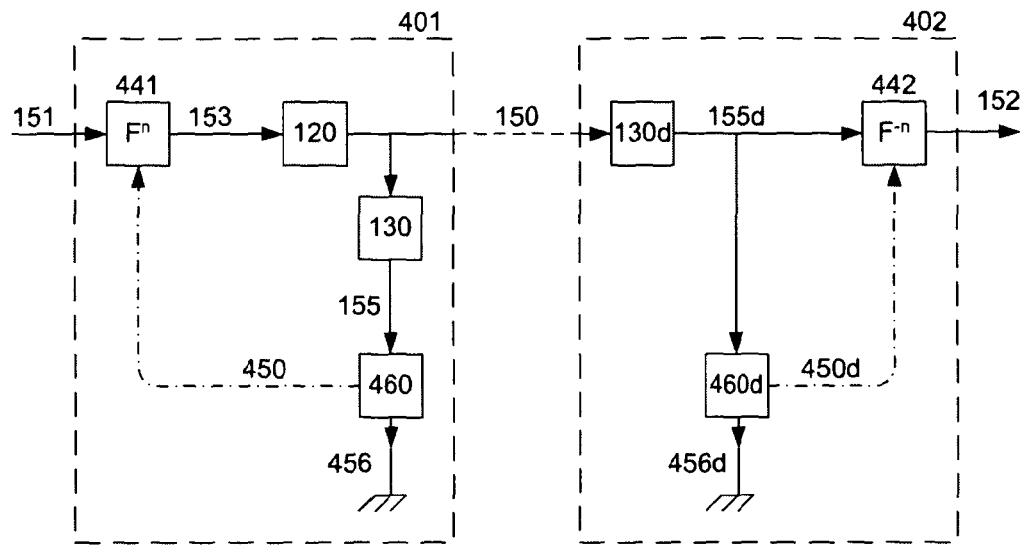
FIG. 4A shows adaptive pre-emphasis and de-emphasis according to the invention.

An encoder 401 according to the invention and implementing this controlled spectral compression is shown in FIG. 4A, in which solid lines represent signal paths and dot-dash lines represent transfer of coefficients. Quantiser 120 and inverse quantiser 130 are akin to their counterparts in FIG. 3. Adaptive whitening filter 460, referred to also as a 'training filter', whitens as far as possible the QIS 155. We denote the time-varying response (transfer function) of filter 460 by F(z), or simply as F. It is the time-varying coefficients that produce the response F that are of interest; the whitened signal output 456 of filter 460 is not needed and can be discarded as shown; alternatively it need not be produced unless required for internal use within the adaptation. For clarity, this output 456 will be omitted from subsequent diagrams.

The coefficients of the training filter 460 are passed along the path 450 and used to configure a forward-path filter 441 that receives the input signal 151 and furnishes a signal 153 that is fed to quantiser 120. Filter 441 is intended to implement a response $F^n$, or an approximation thereto, where n is typically an integer≥1. As F is in general time-varying, filter 441 has adjustable coefficients that are continually adjusted in order to implement the time-varying response $F^n$.

To analyse the spectral behaviour of this encoder architecture, we assume steady-state conditions and also that the discarded signal output 456 of the fully-adapted filter 460 is indeed spectrally white, having a spectral density k where k is constant. Inspection shows that the transfer function from input 151 to the discarded signal 456 has a factor $F^n$ from filter 441 and a factor F from filter 460 and is thereby $F^{(n+1)}$. It follows that the spectral density D(f) of the input signal is given by $$D = k/F^{(n+1)} \quad (5)$$

from which $$F = (k/D)^{1/(n+1)} \quad (6)$$

The spectral density Q(f) of the QIS is given by $$\begin{aligned} Q &= D \cdot F^n \quad (7) \\ &= D \cdot (k/D)^{n/(n+1)} \\ &= k^{n/(n+1)} \cdot D^{1/(n+1)} \end{aligned}$$

The term $D^{1/(n+1)}$ represents a compression factor of (n+1) when the spectral densities D and Q are plotted logarithmically, for example on a decibel scale as in FIG. 3 and as will be assumed throughout this document. A compression factor four would be obtained by setting n=3.

Figure 4B:
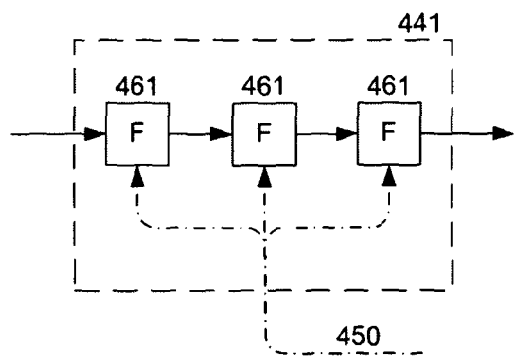
FIG. 4B shows implementation of a response $F^3$ as a cascade of component filters having a response F.

Given a filter with response F, a filter with response $F^n$, where n is an integer 1, may be implemented as n cascaded copies of F. FIG. 4B shows, for the case n=3, a filter 441 implemented as a cascade of three configurable filters 461, each filter receiving coefficients derived from the adapted filter 460 of FIG. 4A via the path 450. The path 450 may represent a copying operation performed from time to time, or it may be implemented by sharing the same coefficient memory between the three filters 461 and the filter 460, so that the coefficients of filter 460 are identified with at least some of the coefficients of the filter 441. If F represents a transversal (FIR) filter, then another way to implement a filter $F^n$ is to convolve the coefficient sequence of F with itself, repeated convolution providing longer coefficient sequences implementing higher integer powers of F. Note that the two methods are not strictly equivalent when time-variation of the coefficients is taken into account.

The decoder 402 of FIG. 4A comprises an inverse quantiser 130d which produces the received QIS 155d, which is filtered by filter 442 which in turn furnishes the decoded output 152. On the assumption that signal 155d is an approximation to signal 155, training filter 460d should furnish coefficients similar to those produced by filter 460 in the encoder, representing a response F. It will be seen that filter 442 should have a response approximating $F^{-n}$ in order that the decoded output 152 should be an approximation to the encoder's input signal 151. We now therefore consider how a response $F^{-n}$ may be implemented.

As noted earlier, (F−1) and (1−F) are filters that do not contain a delay-free path so that it is legitimate to put feedback around them. We assume further that F is causal and minimum-phase, so that $F^{-1}$ and $F^{-n}$ are also causal minimum-phase filters.

Figure 4C:
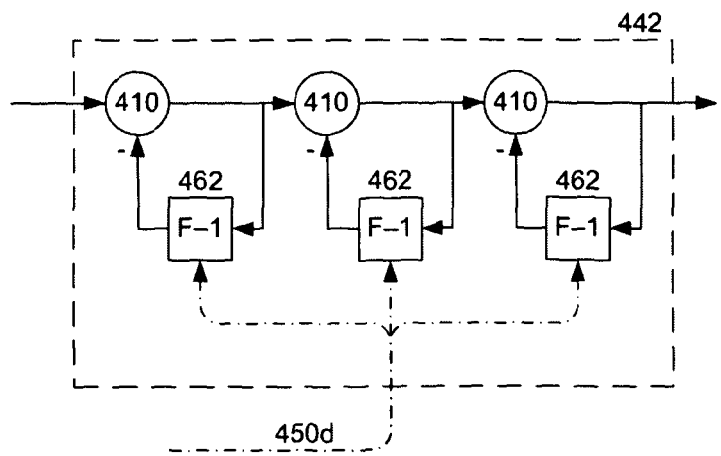
FIG. 4C shows implementation of a response $F^{-3}$ as a combination of component filters having a response F−1.

Under these conditions the architecture of FIG. 4C implements a filter 442 whose response is $F^{-3}$. FIG. 4C shows three cascaded sub-filters, each consisting of a subtractor 410 whose output is coupled to its inverting input via a filter 462 whose response is F−1. Analysis shows that the sub-filter has a response $F^{-1}$ so the sub-filter can be cascaded n times in order to provide a response F. If F is a transversal (FIR) filter, it is straightforward to implement a response F−1 by deleting the delay-free path in F. Analysis shows further that the architecture of FIG. 4C correctly inverts the processing performed by FIG. 4B even if the filters are time-varying, provided that the filters 462 are updated synchronously with the filters 461. This synchronous updating may be achieved by suitably configuring the copying paths 450 and 450d, or alternatively it may be automatic if memory is shared between the 'F' coefficients of the filters 461 and adaptive filter 460, and similarly between the filters 462 and adaptive filter 460d.

In the codecs of FIG. 1 and of FIG. 4A, quantisation errors produced by the quantiser 120 are manifest as a difference between the quantised innovation signal 155 and the unquantised innovation signal 153. If quantisation error is modelled as additive noise, this noise will be reproduced in the decoder's signal 155b and in the case of FIG. 4A will be spectrally shaped by the decoder's filter 442, having transfer function $F^{-n}$ This shaping may be considered undesirable psychoacoustically. In fact the action of encoder 401 can be described as partially whitening the input signal by means of adaptive pre-emphasis, rather than by prediction. This contrasts with FIG. 1 in which the decoder 102 will similarly shape quantisation noise produced by the encoder's quantiser 120, but in the encoder 101 there is signal feedback round the quantiser 120 via predictor 140. The effect of this signal feedback is to pre-shape the encoder's quantisation noise so as to compensate the filtering 442 in the decoder. Hence spectrally white quantisation noise added by quantiser 120 will result in additive white noise at the decoder's output 152.

In FIG. 4A, however, there is no signal feedback round the quantiser, only control feedback via path 450. If desired, error feedback may be applied around quantiser 120 and inverse quantiser 130 using the known technique of 'noise shaping', in order to achieve the same effect as the shaping just described in relation to FIG. 1. Alternatively, noise shaping may be used to shape the noise from quantiser 120 such that the resulting noise at the decoder's output 152 has some spectrum chosen for minimal audibility. The time-varying response of filter 442 may however be an unwelcome complication in the design of such noise shaping, so it may be preferred to avoid this variation by using architecture of FIG. 5A.

Figure 5A:
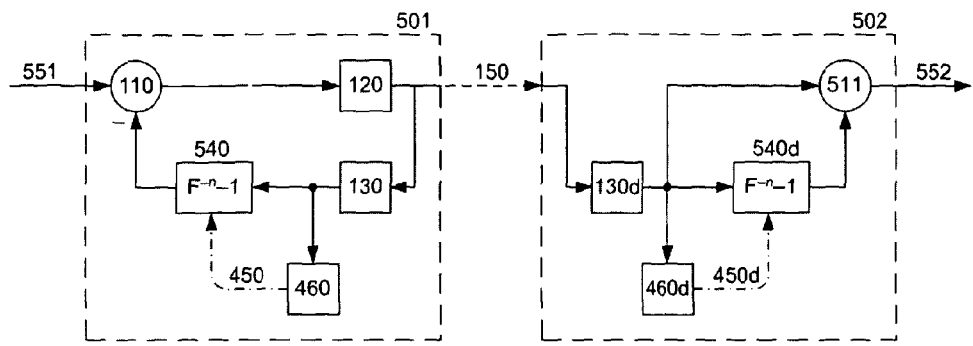
FIG. 5A shows adaptive prediction according to the invention.

The codec of FIG. 5A can be characterised by comparison with the previous discussions of FIG. 1 and of FIG. 4A, since it inherits properties from each of these. FIG. 5A can be regarded as an instance of FIG. 1 in which the encoder's adaptive predictor 140 is implemented by a combination of the training filter 460, the configurable filter 540 and the coefficient copying path 450; similarly in decoding the predictor 140d is implemented as a combination of 460d, 540d and 450d. It follows from the discussion of FIG. 1 that the encoder 501 and decoder 502 are complementary, so that output 552 is a replica of input 551, save for the addition of noise introduced by the action of quantiser 120. This noise can be shaped if desired by applying error feedback (noise shaping) round quantiser 120 and inverse quantiser 130. Moreover, the complementary inverse property is maintained even if F is time-varying, provided that the two filters 540 and 540d are architecturally identical as well having the same response $F^{-n}-1$.

Meanwhile, it will be clear that the action of decoder 502 can be made identical to that of decoder 402 if filter 540d is configured to have a response $F^{-n}-1$ as shown, so that filter 540d and adder 511 in combination implement the response $F^{-n}$ of filter 442. Since the signal response of encoder 401 is the inverse of the signal response of decoder 402, it follows that the encoders 401 and 501 have identical responses $F^n$ to a signal, and therefore that the codec of FIG. 5A operates with the same uniform spectral compression characteristic as does the codec of FIG. 4A.

Figure 5B:
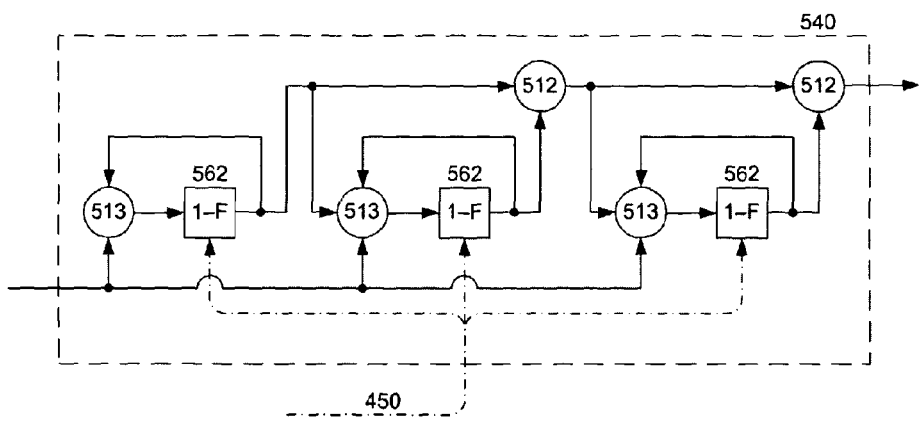
FIG. 5B shows implementation of a response $F^{-3}-1$ as a combination of component filters having a response 1−F.

We now consider how the response $F^n-1$ of filters 540 and 540d may be implemented, taking as an example the case n=3. FIG. 5B shows a method of synthesising a response $F^{-3}-1$ from three instances of a component filter 562 that has a response 1−F, where as before, F is assumed to have a unity first impulse response so that 1−F can be implemented with no delay-free path. The coefficients of 1−F can be derived from those of the training filter F by a incorporating a negation into the copying paths 450 and 450d. Alternatively component filters having response F−1 may be used, avoiding the need for negation on copying and allowing shared memory as discussed with reference to filters 461 and 462 in FIGS. 4B and 4C. If each component filter 562 has response F−1, then each should conceptually be followed by a negation, which in practice can be incorporated into a following arithmetic addition node 512 or 513 by using a node having an inverting input.

Figure 5C:
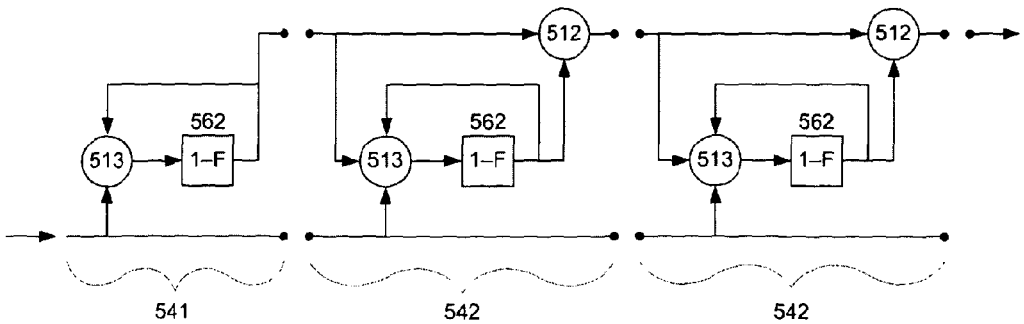
FIG. 5C shows implementation of a response $F^{-n}-1$ for general n.

The structure of FIG. 5B can be generalised to implement a response $F^{-n}-1$ for other values of n as indicated in FIG. 5C, in which the coefficient paths have been omitted for clarity. A filter with response $F^{-n}-1$, where n≥1, can be implemented as an initial filter section 541 followed by (n−1) instances of filter section 542, connected in the manner shown.

In practice, implementation of several copies of a filter having a response F or F−1 is unlikely to result in a severe load on a typical Digital Signal Processor, which is well suited to the task. The major computational load is likely instead to be in the adaptation of the coefficients of the training filter 460.

The adaptation of the training filter 460 may be performed using any of several prior art methods, such as the normalised least-mean-squares (NLMS) method discussed previously. In some cases it will be necessary to adjust the adaptation parameters on account of the coefficient feedback path 450 in the encoder. The adaptation may be stabilised if necessary by adapting the coefficients more slowly, that is, by reducing the parameter μ in the adaptation formulas (2) and (3) displayed earlier. Since the input 155 of the adaptive whitening filter has the benefit of spectral compression it may be possible to apply moderate leakage without suffering the severe variation in the spectral compression ratio that results, as noted in relation to FIG. 3C, when a prior art codec that uses an LMS algorithm with leakage us used to handle the full spectral dynamic range of a typical audio signal. When the invention is being used, leakage is not the principal means to control spectral deviations caused by transmission errors, nevertheless some leakage is still useful to achieve synchronism between the encoder's and the decoder's filter adaptation in the presence of arithmetic rounding errors, and to stabilise the performance generally.

A plain LMS adaptation algorithm is unable maintain a sensible adaptation rate in the presence of the very large changes in signal amplitude found in typical audio signals. The NLMS algorithm incorporates normalisation to address this problem, while the G722 algorithm (Recommendation G.722 "7 kHz Audio—Coding within 64 kbit/s", International Telecommunications Union, 1988 & 1993) addresses the problem of dynamic range by considering only the signs (positive, zero or negative) and disregarding the magnitudes of the signals relevant to the adaptation.

Figure 6A:
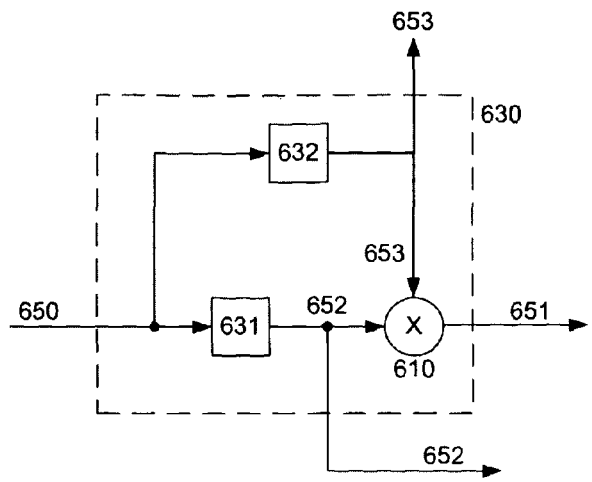
FIG. 6A shows an inverse quantiser incorporating the step of adaptation.

Another method to cope with wide dynamic range is to feed the training filter from a normalised version of the QIS. Such a normalised signal will typically be produced within each inverse quantiser of an ADPCM codec as shown in FIG. 6A. Here inverse quantiser 630 receives symbol stream 650 which is decoded by a reconstruction unit 631, typically a look-up table, to generate a normalised signal 652 containing waveform information but having a highly compressed envelope. Stream 650 feeds also a step size adaptation unit 632, which furnishes a scale factor 653 that is used by multiplier 610 to multiply signal 652 and thus deliver the correctly scaled QIS 651.

Figure 6B:
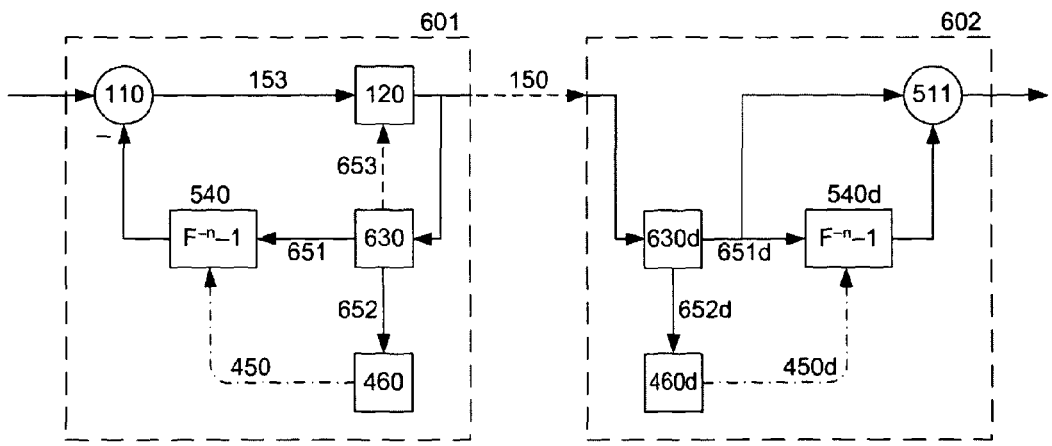
FIG. 6B shows how filters in the predictor of FIG. 5A may be trained from a normalised quantised innovation signal, using the inverse quantiser of FIG. 6A.

FIG. 6B shows how the encoder and decoder of FIG. 5A may be modified to take advantage of the normalised QIS produced by inverse quantiser 630. Here the symbol stream 154 of FIG. 1 is identified with the stream 650 of FIG. 6A. In the encoder 601, the inverse quantiser 630 furnishes the QIS 651 which feeds the prediction filter 540, while the normalised QIS 652 feeds the training filter 460. Similar operations are performed in the decoder 602. The scale factor 653 is used by quantiser 120 as well as internally within the inverse quantiser 630. The effect is as if quantiser 120 had divided the innovation signal 153 by the scaling factor 632 before quantising, though in practice this division is normally avoided by scaling the quantisation thresholds instead. The subsequent multiplication 610 within inverse quantiser 630 then restores the correct scaling of the inverse quantised signal 651 as already noted. However the signal 652, having a highly compressed dynamic range, is available for use by training filter 460 as shown.

The normalised QIS 652 will differ spectrally from the unnormalised QIS 651 because in quantiser 120 the effective division by the time-varying scale factor 653 will generate sidebands; nevertheless the use of the normalised QIS for training will often be more attractive on grounds of computational efficiency than using a self-normalising adaptation algorithm such as NLMS. Normalisation will not normally be instantaneous, and sudden increases in the amplitude of the original audio signal may cause the signal 652 to take a large value transiently and possibly provoke instability through excessive adaptation speed. Such transient misbehaviour can be controlled by use of clipping, for example by clipping the signal 251 in FIG. 2A to twice its usual rms value, and possibly by further clipping of the error signal $e_n$ in FIG. 2A.

For the decoder 402 to implement a filter 442 having response $F^{-n}$, the gain of F must not be zero at any frequency; moreover F must have a minimum-phase response if $F^{-n}$ is to be a causal and stable filter. The same conditions are required in the decoder 502. It is known that the LMS and similar algorithms do converge in the mean towards a minimum-phase response, but as the process is stochastic there is no guarantee that the minimum-phase condition will not be violated transiently.

In the z-transform domain, the minimum-phase condition is that the zeroes of F(z) should always lie inside the unit circle, so that the poles of $F(z)^{-n}$ also lie inside the unit circle. Ideally there should be some safety margin, since poles close to the unit circle result in high gain in the decoder, and hence amplification of any disturbances to the received QIS 155*d* caused by transmission channel errors.

An example of a signal that may cause trouble is a single sinewave, which theoretically will cause a plain LMS algorithm to converge to a filter having zeroes of F(z) on the unit circle. Coefficient leakage will restrain the zeroes somewhat, but leakage alone is not always sufficient and has disadvantages as already mentioned. In the case that filter 441 is a transversal (FIR) filter, the desired safety margin can be obtained by simple adjustment of coefficients as they are transferred along the copying path 450, using a technique known as 'bandwidth expansion' (P. Kabal, "III-Conditioning and Bandwidth Expansion in Linear Prediction of Speech", *Proc. IEEE Int. Conf. Acoustics, Speech, Signal Processing*, pp. I-824-I-827, 2003). According to this technique, the coefficient of $z^{-i}$ is scaled (i.e., multiplied) by $\gamma^i$ for some $0<\gamma<1$. This has the effect of multiplying each zero of the filter 441 by a factor $\gamma$, i.e. bringing the zero to a position closer to the centre of the unit circle. If the unmodified response of the filter 441 was $F(z)^n$ and the response of the modified filter is $F'(z)^n$, then $$F'(z)=F(z/\gamma) \quad (8)$$

The replacement of F(z) by F'(z) should of course be made consistently between filters 441 and 442 in the encoder 401 and decoder 402, implying that this replacement should also apply in filters 461 and 462; similarly the replacement should be made in filters 540 and 540*d*. For filters that are not plain transversal filters, the same principles can be applied, for example a coefficient of $z^i$ can be scaled by a factor $\gamma^i$ in both the numerator and denominator of a biquad or other recursive filter. Although the coefficient modification must be applied consistently between an encoder and a decoder, consistent modification is not required in the different sections of a filter. For example, it may not be necessary to modify the denominator of a recursive filter F, or alternatively a different modification may be used.

A suitable value for $\gamma$ may be found empirically. If $\gamma$ is too small, prediction gain will be reduced excessively. If $\gamma$ is too large, then there may be inadequate safety margin against violation of the minimum-phase condition. A use of $\gamma<1$ also restrains the encoder from placing excessively deep nulls in its prediction filter in the case that the input signal contains one or more pure sine waves. Such "notching out" in the encoder would require the decoder to provide a very high resonant peak in its response, increasing the sensitivity to transmission channel errors. Leakage alone will be ineffective in controlling this behaviour, and a combination of a modest amount of leakage and coefficient modification using $\gamma$ is recommended. Bandwidth expansion multiplies the last tap of an n-tap filter by $\gamma^n$ and it may be considered that coefficients that are thus multiplied by a factor of less say 0.5 do not provide enough decorrelation to justify their computational cost, and a filter with fewer taps should be considered. In practice a value $\gamma=0.875$ has been used for a fourth order filter or $\gamma=0.995$ for a 64th order filter.

Typical audio applications benefit from the use of more than one prediction filter, so that a single filter does not have to address conflicting requirements. For example, speech contains both voiced vowels that have a harmonic structure, and explosive consonants that cause sudden spectral changes and require rapid adaptation if prediction gain is to be maintained. The voiced consonants favour the use of a high order filter, for example a transversal filter with several tens of taps, while the explosive consonants are more suited to a low order filter having lower spectral resolution but configured for faster adaptation.

Figure 7A:
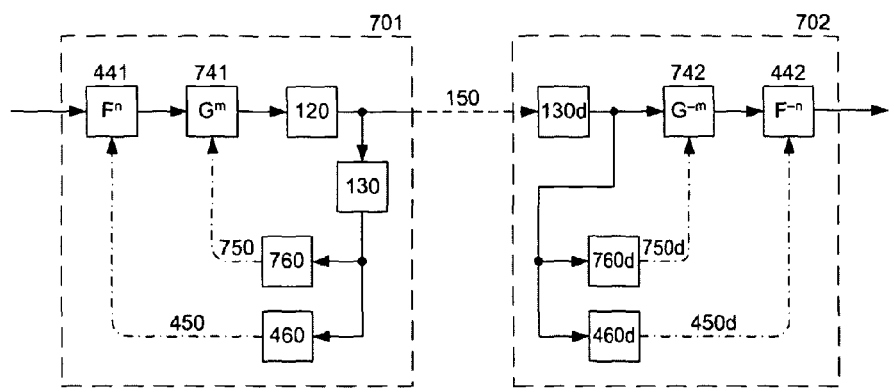
FIG. 7A shows two cascaded separately adapted filters used for pre-emphasis.

FIG. 7A shows an encoder 701 and decoder 702 according to the invention, the encoder containing two cascaded filters 441 and 741, while the decoder contains corresponding filters 442 and 742. Filters 441 and 442 operate as was discussed with reference to FIG. 4, while filters 741 and 742 operate similarly, each being associated with a training filter 760 or 760*d*. Subject to stability conditions and in the absence of transmission errors, the coefficients of training filter 760*d* will converge towards the same values as those of training filter 760. We will denote the response of the training filters 760 and 760*d* by G(z), where G is time-varying. The coefficients of training filter 760 are communicated via path 750 to filter 741, which is thereby configured to have a response that approximates $G^m$, where m is typically an integer$\geq 1$. Similarly the coefficients of filter 760*d* are communicated via path 750*d* to filter 742. With suitable filter architectures, and under the assumptions that G(z) is causal and minimum-phase, with a first impulse response of unity, the action of filter 741 having response $G^m$ can be exactly inverted by filter 742 having response $G^{-m}$ even when the coefficients are time-varying. Because of the variation of coefficients, the order of the filters in the encoder is significant and the corresponding inverse filters in the decoder should be placed in a reversed order, as shown.

If the transfer functions F(z) and G(z) were to have the same modelling capability, and if the corresponding training filters 460 and 760 were to use the same adaptation algorithm, then these training filters 760 and 460 would converge to have the same response and the architecture of FIG. 7 would behave in a manner substantially identical to that of FIG. 4 but with n replaced by (n+m). FIG. 7A is therefore useful when the two filters adapt to different aspects of the input signal. For example, F might be an FIR filter with a larger number of taps providing higher spectral resolution and aiming to take advantage of long term correlations, perhaps associated with a pitch period, whilst G(z) might be a short filter having lower spectral resolution but aiming to equalise a large spectral dynamic range between low and high frequencies. In this case the forward path filter $G(z)^m$ would probably be implemented using a higher power m than the power n of the forward path filter $F(z)^n$. A higher m, for example m=2 or m=3, helps $G(z)^m$ to whiten a signal having a high spectral dynamic range, where G(z) is a short filter having fast adaptation. Higher n however may induce unstable adaptation of the longer filter F(z), having regard to the feedback loop within the encoder via the coefficient path 450. In practice a value n=1 may be sufficient. It is advantageous to place the longer filter $F(z)^n$ prior to a shorter and faster-adapting filter $G(z)^m$ in the forward path of the encoder, so that the long filter, having higher frequency resolution, is able to process a spectrally pure input signal before the purity has been reduced by sidebands caused by the action of the rapidly varying filter $G(z)^m$.

While F(z) may provide high spectral resolution and G(z) may provide speed of response, broad spectral features that persist for some time may be 'seen' by both training filters, and therefore corrected by both forward-path filters $F(z)^n$ and $G(z)^m$. These features will thereby be compressed spectrally in the ratio (m+n+1):1. If this higher compression spectral compression ratio is considered undesirable, it can be avoided by feeding the training filter 760 not from the QIS but from a signal such as 456 in FIG. 4 that has been whitened already by the other training filter 460. However in practice it has been found more satisfactory to discard the signal 456 and train both filters from the QIS as shown in FIG. 7A.

Figure 7B:
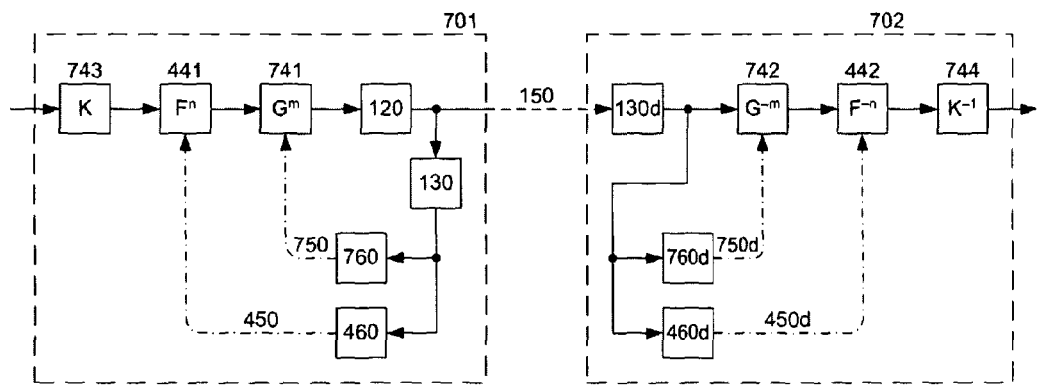
FIG. 7B shows two cascaded separately adapted filters plus a fixed filter used for pre-emphasis.

It will be clear that the architecture of FIG. 7A can be extended to use three or more cascaded filters in the forward path of the encoder, the decoder containing the corresponding inverse filters in reverse order. There may be merit in incorporating a fixed filter into the cascade to assist the decorrelation provided by the signal-dependent filter responses F, G etc. While some audio signals have a rising frequency spectrum, the majority have a spectrum that falls above 500 Hz or so, at a rate often around 12 dB/8ve and sometimes (e.g. on pianos) as high as 24 dB/8ve, leading to a spectral dynamic range of 60 dB or more between the loud low frequency content and the quiet high frequency content. If a range of 60 dB is compressed by a factor of, for example, four according to the invention, a spectral range of 15 dB remains, which is larger than desirable for optimal compression. A simple fixed preemphasis filter, for example $K(z)=1-(^{15}/_{16}) \cdot z^{-1} = 1 - 0.9375 \cdot z^{-1}$ which provides a near-Nyquist gain of +29.8 dB relative to the low frequency gain, will reduce the spectral range to be handled by the signal-dependent filters to about 30 dB, leading perhaps to a compressed spectral range of 7.5 dB, which provides near-optimal prediction gain and hence compression efficiency. FIG. 7B is like FIG. 7A but incorporates also filter 743 having response K(z) into encoder 701 and filter 744 having inverse response $K(z)^{-1}$ into the decoder 70. With K(z) incorporated, the complete time-varying forward transfer function of the encoder is given by:

$$W(z) = K(z) \cdot F^n(z) \cdot G^m(z) \qquad (9)$$

or alternatively by $$W(z) = K(z) \cdot F^n(z/\gamma_1) \cdot G^m(z/\gamma_2) \qquad (10)$$

where $\gamma_1$, $\gamma_2$ provide bandwidth expansion, perhaps differently for the two factors F and G as discussed earlier. The decoder's response $W^{-1}(z)$ is the inverse of the encoder's response W(z).

Figure 8A:
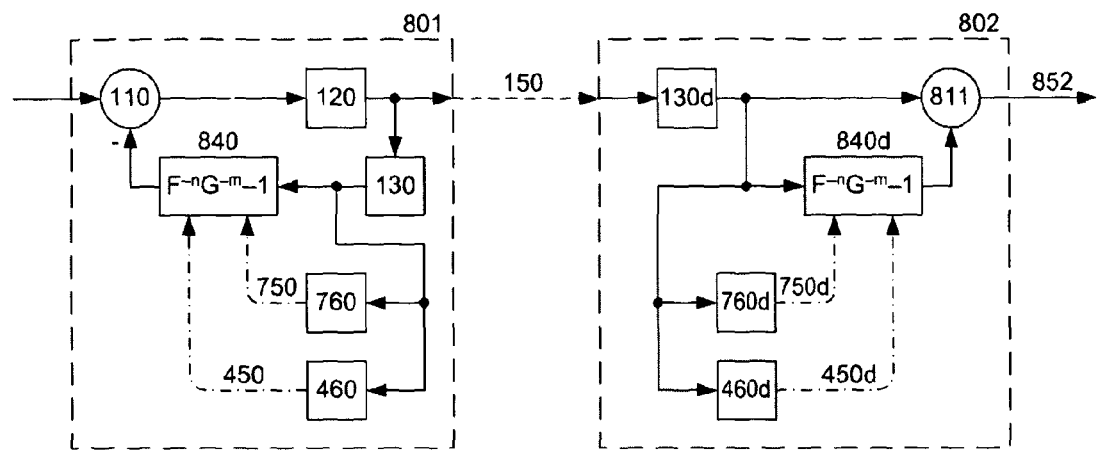
FIG. 8A shows two cascaded separately adapted filters used for prediction.

As in the decoder 402 of FIG. 4A, the inverse filters 742 and 442 in the decoder 702 of FIG. 7A will cause spectral shaping of quantisation noise introduced by the encoder, a feature that may be considered undesirable. FIG. 8A bears the same relationship to FIG. 7A as FIG. 5A does to FIG. 4A, and shows how shaping can be avoided when multiple filters are used.

Referring to FIG. 8A, we note that the combination of filter 840d and the direct path from inverse quantiser 130d to adder 811 in decoder 802 has response $F^{-n} \cdot G^{-m}$, and is thus equivalent, ignoring time-varying aspects, to the combination of filters 742 and 442 in decoder 702. On the other hand, by the arguments already used in relation to FIG. 5A, and subject to stability conditions and to filters 840 and 840d having the same architectures and synchronously adjusted coefficients, the filtering in decoder 802 inverts exactly the filtering in encoder 801, even when the coefficients are time-varying. Further by the same arguments used previously, quantisation noise introduced by quantiser 120 is reproduced at the decoder's output 852, without shaping.

Figure 8B:
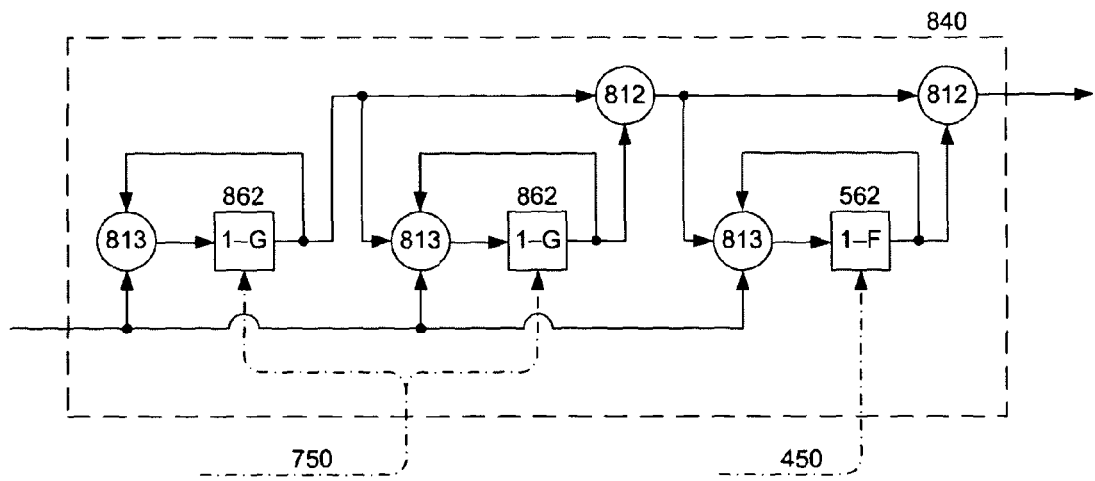
FIG. 8B shows how a response $F^{-1}.G^{-2}-1$ may be implemented using component filters having responses $1-F$ and $1-G$.
Figure 8C:
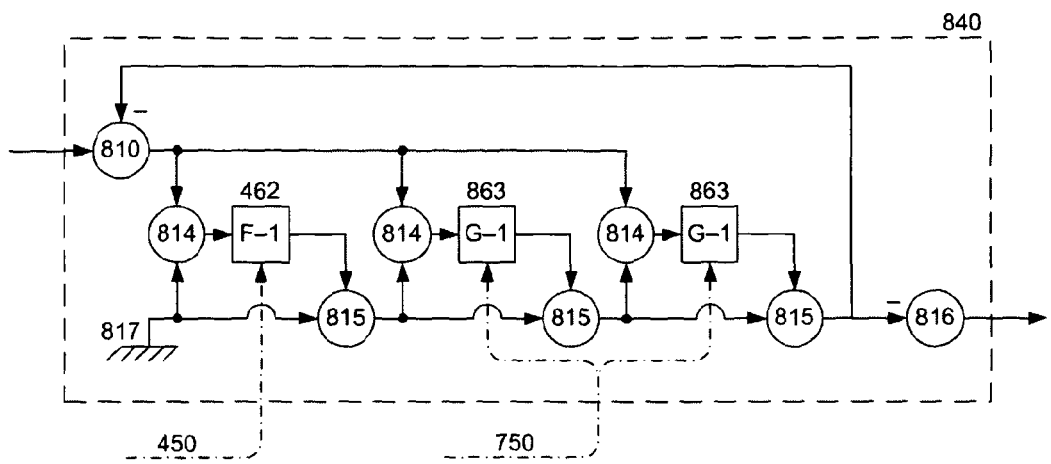
FIG. 8C shows an alternative implementation of a response $F^{-1}.G^{-2}-1$ using component filters having responses $F-1$ and $G-1$; and, FIG. 8D shows how a response $K^{-1}.F^{-1}.G^{-2}-1$ may be implemented using component filters having responses $K-1$, $F-1$ and $G-1$.

FIGS. 8B and 8C show two examples of filter architectures that may be used to implement filters 840 and 840d having a response $F^{-n} \cdot G^{-m} - 1$, for the particular case {n=1; m=2}. In FIG. 8B, the filters 862 implement a response 1−G(z). In FIG. 8C, the processing node 810 is a subtractor and unit 816 performs negation. The component filter 462 implements a response F(z)−1 and each of the two filters 863 implements a response G(z)−1. The 'chassis' symbol 817 is conceptual and indicates that a zero signal is supplied to the two adders 814 and 815 to which it is connected.

The ordering of F and G filters is significant, the two architectures of FIG. 8B and FIG. 8C both being suitable for use where F is the longer filter, as it can be shown that when either architecture is used within the encoder 801, the component filter F will 'see' a signal equal to the input signal plus quantisation noise, without sidebands introduced by the time variation of the G filters. To ensure consistency between the two filters 840 and 840d, a single architecture should be chosen and used to implement both filters.

Figure 8D:
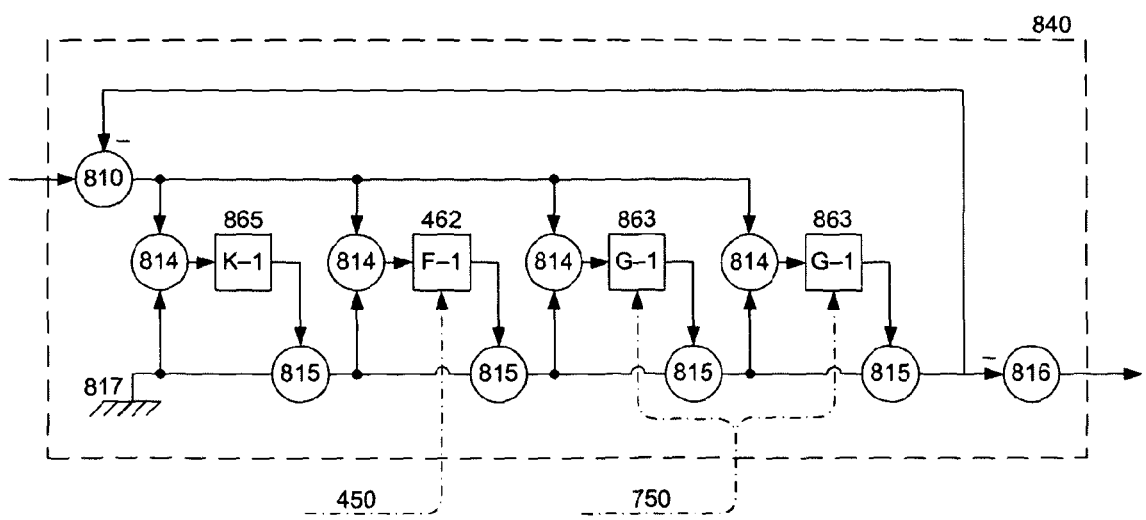

It will be clear how the architectures of FIG. 8B and FIG. 8C can be extended to accommodate different values of m and n or a different number of distinct filter responses F, G, etc. FIG. 8D implements three distinct filter responses F, G and K. It has been assumed that the filter response K(z) is fixed, so the filter 865 is not provided with a coefficient communication path. In FIG. 8D, the response K(z) has been implemented first. The position within the chain of filters of a fixed filter K(z) that does not have narrow or deep response notches is unlikely to raise considerations related to sideband generation and can be chosen to make the best use of arithmetic headroom or otherwise as convenient. The present invention allows a partially whitened signal to be generated from an input signal with a time-varying relationship that depends on the spectrum of the partially whitened signal in a controlled manner. An adaptive whitening filter is used to guide an adaptation process by providing time-varying coefficients which depend on the spectrum of the partially whitened signal and which are used for adjustment. As such, the spectral relationship of the partially whitened or 'compressed' signal can depend in a controlled manner on the spectrum of the input signal, in contrast to prior art methods. In a reverse process, the relationship of an output spectrum to the spectrum of the partially whitened signal may be adjusted in a controlled manner and, if suitably configured, may substantially invert the original processing. These techniques may be embodied in various encoders, decoders and codec devices. Using one aspect of the present invention, an encoder for encoding an audio signal can be realised, which uses an adaptive filter to compress the spectral dynamic range of an input signal by a substantially constant ratio. As will be appreciated by those skilled in the art, various implementations and embellishments of the invention are possible, with appropriate adjustment of the filter responses and coefficients.

The invention claimed is:

1. A method of adaptively filtering an input signal having an input spectral dynamic range and related to an audio signal to furnish a partially whitened signal having a reduced spectral dynamic range compared to the input spectral dynamic range, the method comprising the steps of:
   filtering the input signal in dependence on adjustable time-varying coefficients to furnish the partially whitened signal, the relationship of the partially whitened signal to the input signal being described by a time-varying response W(z);
   feeding the partially whitened signal to a first adaptive whitening filter having coefficients that vary with time, the first adaptive whitening filter filtering the partially whitened signal with a time-varying response $F_1(z)$; and,
   adjusting the adjustable time-varying coefficients in dependence on the coefficients of the first adaptive whitening filter.

2. A method according to claim 1, wherein at least one of the adjustable time-varying coefficients is identified with a coefficient of the first adaptive whitening filter, whereby the step of adjusting is performed as part of normal operation of the first adaptive whitening filter.

3. A method according to claim 1, wherein the step of adjusting comprises copying coefficients of the first adaptive whitening filter to the adjustable time-varying coefficients.

4. A method according to claim 3, wherein the copying comprises scaling a coefficient by a factor $\gamma^j$, where $0.7 < \gamma \leq 1$ and where the coefficient multiplies a signal sample having a delay of j samples.

5. A method according to claim 1, wherein the response $W(z)$ incorporates a factor $F_1(z/\gamma)^n$ where $0.7 < \gamma \leq 1$ and where n is a positive integer.

6. A method according to claim 5, wherein the positive integer n is selected from the integers 1, 2, 3, 4 and 5.

7. A method according to claim 1, wherein the step of filtering is performed using a component filter whose response is proportional to $F_1(z/\gamma) - 1$.

8. A method according to claim 1, comprising the further step of feeding the partially whitened signal to a second adaptive whitening filter, wherein the second adaptive whitening filter filters the partially whitened signal with a time-varying response $F_2(z)$, and wherein the time-varying response $W(z)$ incorporates a factor $F_2(z/\gamma_1)^{n_2} F_2(z/\gamma_2)^{n_2}$ for some $\gamma_1, \gamma_2 \leq 1$ and integers $n_1, n_2 \geq 1$.

9. A method according to claim 8, wherein the second adaptive whitening filter has lower spectral resolution and adapts more quickly than the first adaptive whitening filter.

10. A method according to claim 8, wherein the second adaptive whitening filter has lower spectral resolution than the first adaptive whitening filter and wherein $n_2 > n_1$.

11. A method according to claim 1, wherein the time-varying response $W(z)$ incorporates a fixed factor $K(z)$ where $K(z)$ is not a constant multiplier.

12. A method according to claim 1, wherein the first adaptive whitening filter is an FIR filter that adapts its coefficients using the Least Mean Square (LMS) method of Widrow and Hoff.

13. A method according to claim 1, wherein the step of filtering comprises the steps of:
generating a predicted sample of the input signal in dependence on previous samples of the partially whitened signal and on the adjustable time-varying coefficients;
subtracting the predicted sample from a sample of the input signal to furnish a difference sample; and,
deriving a sample of the partially whitened signal in dependence on the difference sample.

14. A method according to claim 13, wherein the step of deriving comprises quantising the difference sample or a sample generated therefrom.

15. A method according to claim 13, wherein the step of deriving comprises furnishing a normalised version of the partially whitened signal, and wherein it is the normalised version of the partially whitened signal that is fed to the first adaptive whitening filter in the step of feeding.

16. A method of adaptively filtering a partially whitened signal having a reduced spectral dynamic range to produce an output signal having an output spectral dynamic range which is increased compared to the reduced spectral dynamic range, the method comprising the steps of:
filtering the partially whitened signal in dependence on adjustable time-varying coefficients to furnish the output signal, the relationship of the output signal to the partially whitened signal being described by a time-varying response $W^{-1}(z)$;
feeding the partially whitened signal to a first adaptive whitening filter having coefficients that vary with time, the first adaptive whitening filter filtering the partially whitened signal with a time-varying response $F_1(z)$; and,
adjusting the adjustable time-varying coefficients in dependence on the coefficients of the first adaptive whitening filter.

17. A method according to claim 16, wherein at least one of the adjustable time-varying coefficients is identified with a coefficient of the first adaptive whitening filter, whereby the step of adjusting is performed as part of normal operation of the first adaptive whitening filter.

18. A method according to claim 16, wherein the step of adjusting comprises copying coefficients of the first adaptive whitening filter to the adjustable time-varying coefficients.

19. A method according to claim 18, wherein the copying comprises scaling a coefficient by a factor $\gamma^j$, where $0.7 < \gamma \leq 1$ and where the coefficient multiplies a signal sample having a delay of j samples.

20. A method according to claims 16, wherein the response $W^{-1}(z)$ incorporates a factor $F_1(z/\gamma)^{-n}$ where $0.7 < \gamma \leq 1$ and where n is a positive integer.

21. A method according to claim 20, wherein the positive integer n is selected from the integers 1, 2, 3, 4 and 5.

22. A method according to claim 16, wherein the step of filtering is performed using a component filter whose response is proportional to $F_1(z/\gamma) - 1$.

23. A method according to claim 16, comprising the further step of feeding the partially whitened signal to a second adaptive whitening filter, wherein the second adaptive whitening filter filters the partially whitened signal with a time-varying response $F_2(z)$, and wherein the response $W^{-1}(z)$ incorporates a factor:

$$F_1\left(\frac{z}{\gamma_1}\right)^{(-n_1)} F_2\left(\frac{z}{\gamma_2}\right)^{(-n_2)}$$

for some $\gamma_1, \gamma_2 \leq 1$ and integers $n_1, n_2 \geq 1$.

24. A method according to claim 23, wherein the second adaptive whitening filter has lower spectral resolution and adapts more quickly than the first adaptive whitening filter.

25. A method according to claim 23, wherein the second adaptive whitening filter has lower spectral resolution than the first adaptive whitening filter and wherein $n_2 > n_1$.

26. A method according to claim 16, wherein the time-varying response $W^{-1}(z)$ incorporates a fixed factor $K^{-1}(z)$ where $K(z)$ is not a constant multiplier.

27. A method according to claim 16, wherein the first adaptive whitening filter is an FIR filter that adapts its coefficients using the Least Mean Square (LMS) method of Widrow and Hoff.

28. A method according to claim 16, wherein the step of filtering comprises the steps of:
generating a predicted sample of the input signal in dependence on previous samples of the partially whitened signal and on the adjustable time-varying coefficients; and,
adding the predicted sample to a sample of the partially whitened signal to furnish a sample of the output signal.

29. An encoder comprising:
an input for receiving an input signal having an input spectral dynamic range and related to an audio signal;
an output for furnishing a partially whitened signal having a reduced spectral dynamic range compared to the input spectral dynamic range;
an adjustable filter coupled to the input and configured to filter the input signal in dependence on adjustable time-varying coefficients to furnish the partially whitened signal, the relationship of the partially whitened signal to the input signal being described by a time-varying response W(z); and, an adaptive whitening filter fed in dependence on the output of the adjustable filter, the adaptive whitening filter having coefficients that vary with time and configured to filter the partially whitened signal with a time-varying response $F_1(z)$, wherein the encoder is configured to furnish the partially whitened signal having the reduced spectral dynamic range by adjusting the adjustable time-varying coefficients in dependence on the coefficients of the adaptive whitening filter.

30. A decoder comprising:

an input for receiving a partially whitened signal having a reduced spectral dynamic range;

an output for furnishing an output signal having an output spectral dynamic range which is increased compared to the reduced spectral dynamic range;

an adaptive whitening filter coupled to the input and configured to filter the partially whitened signal with a time-varying response $F_1(z)$; and, an adjustable filter coupled to the output and configured to filter the partially whitened signal in dependence on adjustable time-varying coefficients to furnish the output signal, the relationship of the output signal to the partially whitened signal being described by a time-varying response $W^{-1}(z)$, wherein the decoder is configured to furnish the output signal having the increased output spectral dynamic range by adjusting the adjustable time-varying coefficients in dependence on the coefficients of the adaptive whitening filter.

31. A codec comprising an encoder in combination with a decoder;

wherein the encoder comprises:

a first input for receiving a first input signal having an input spectral dynamic range and related to an audio signal;

a first output for furnishing a partially whitened signal having a reduced spectral dynamic range compared to the input spectral dynamic range;

a first adjustable filter coupled to the first input and configured to filter the first input signal in dependence on first adjustable time-varying coefficients to furnish the partially whitened signal, the relationship of the partially whitened signal to the first input signal being described by a time-varying response W(z); and, a first adaptive whitening filter fed in dependence on the output of the first adjustable filter, the first adaptive whitening filter having coefficients that vary with time and configured to filter the partially whitened signal with a time-varying response $F_1(z)$, wherein the encoder is configured to furnish the partially whitened signal having the reduced spectral dynamic range by adjusting the first adjustable time-varying coefficients in dependence on the coefficients of the first adaptive whitening filter;

and wherein the decoder comprises:

a second input for receiving a second input signal, the second input signal a partially whitened signal having a reduced spectral dynamic range;

a second output for furnishing an output signal having an output spectral dynamic range which is increased compared to the reduced spectral dynamic range of the second input signal;

a second adaptive whitening filter coupled to the second input and configured to filter the partially whitened signal with a time-varying response $F'_1(z)$; and, a second adjustable filter coupled to the second output and configured to filter the second input signal in dependence on second adjustable time-varying coefficients to furnish the output signal, the relationship of the output signal to the second input signal being described by a time-varying response $W'^{-1}(z)$, wherein the decoder is configured to furnish the output signal having the increased output spectral dynamic range by adjusting the second adjustable time-varying coefficients in dependence on the coefficients of the second adaptive whitening filter;

wherein the decoder is adapted to produce the output signal having a spectrum substantially the same as a spectrum of the input signal to the encoder.

* * * * *